(12) United States Patent
Goericke et al.

(10) Patent No.: US 11,938,515 B2
(45) Date of Patent: Mar. 26, 2024

(54) METHOD FOR TUNING THE RESONANT FREQUENCY OF A PIEZOELECTRIC MICROMACHINED ULTRASONIC TRANSDUCER

(71) Applicant: InvenSense, Inc., San Jose, CA (US)

(72) Inventors: Fabian Goericke, Berkeley, CA (US); Stefon Shelton, Berkeley, CA (US); Benedict Costello, Berkeley, CA (US)

(73) Assignee: InvenSense, Inc., San Jose, CA (US)

( * ) Notice: Subject to any disclaimer, the term of this patent is extended or adjusted under 35 U.S.C. 154(b) by 857 days.

(21) Appl. No.: 16/957,064

(22) PCT Filed: Dec. 21, 2018

(86) PCT No.: PCT/US2018/067260
§ 371 (c)(1),
(2) Date: Jun. 22, 2020

(87) PCT Pub. No.: WO2019/126729
PCT Pub. Date: Jun. 27, 2019

(65) Prior Publication Data
US 2020/0338592 A1 Oct. 29, 2020

Related U.S. Application Data

(60) Provisional application No. 62/609,987, filed on Dec. 22, 2017.

(51) Int. Cl.
*B06B 1/06* (2006.01)
*H10N 30/04* (2023.01)

(52) U.S. Cl.
CPC .......... *B06B 1/0629* (2013.01); *B06B 1/0651* (2013.01); *B06B 1/0666* (2013.01);
(Continued)

(58) Field of Classification Search
CPC ..... B06B 1/06; B06B 1/0603; B06B 2201/55; B06B 1/0651; B06B 1/0662;
(Continued)

(56) References Cited

U.S. PATENT DOCUMENTS 4,259,145 A 3/1981 Harper et al.
6,414,569 B1 7/2002 Nakafuku
(Continued)

FOREIGN PATENT DOCUMENTS

WO 2016/106153 A1 6/2016
WO 2017/218299 A1 12/2017

OTHER PUBLICATIONS

Extended European Search Report in European Application No. 18890914.7, dated Jul. 20, 2021.
(Continued)

*Primary Examiner* — Thiem D Phan
(74) *Attorney, Agent, or Firm* — DLA Piper LLP (US)

(57) ABSTRACT

The teachings of the present disclosure enable the manufacture of one or more piezoelectric micromachined ultrasonic transducers (PMUTs) having a resonant frequency of a specific target value and/or substantially matched resonant frequencies. In accordance with the present disclosure, a flexible membrane of a PMUT is modified to impart a desired parameter profile for stiffness and/or mass to tune its resonant frequency to a target value. The desired parameter profile is achieved by locally removing or adding material to regions of one or more layers of the flexible membrane to alter its geometric dimensions and/or density. In some embodiments, material is added or removed non-uniformly across the structural layer to realize a material distribution that more strongly affects membrane stiffness than mass. In some embodiments, material having a specific residual
(Continued)

stress is added to, and/or removed from, the membrane to define a desired modal stiffness for the membrane.

11 Claims, 9 Drawing Sheets

(52) U.S. Cl.
CPC .......... *B06B 1/0685* (2013.01); *H10N 30/04* (2023.02); *Y10T 29/42* (2015.01)

(58) Field of Classification Search
CPC ... B06B 1/0644; B06B 1/0696; B06B 1/0685; B06B 2201/20; B06B 1/0629; B06B 1/0269; Y10T 29/49005; Y10T 29/42
USPC .............................. 29/25.35, 592.1, 593, 595
See application file for complete search history.

(56) References Cited

U.S. PATENT DOCUMENTS

| | | | |
|---|---|---|---|
| 10,478,858 B2* | 11/2019 | Lasiter | B06B 1/0666 |
| 10,522,737 B2* | 12/2019 | Boser | H10N 30/085 |
| 2011/0291207 A1 | 12/2011 | Martin et al. | |
| 2017/0110504 A1 | 4/2017 | Panchawagh et al. | |
| 2017/0216883 A1 | 8/2017 | Hajati | |

OTHER PUBLICATIONS

Authorized Officer: Shane Thomas, International Search Report and Written Opinion issued in counterpart PCT application No. PCT/US2018/067260, dated Mar. 8, 2019, 9 pp.

* cited by examiner

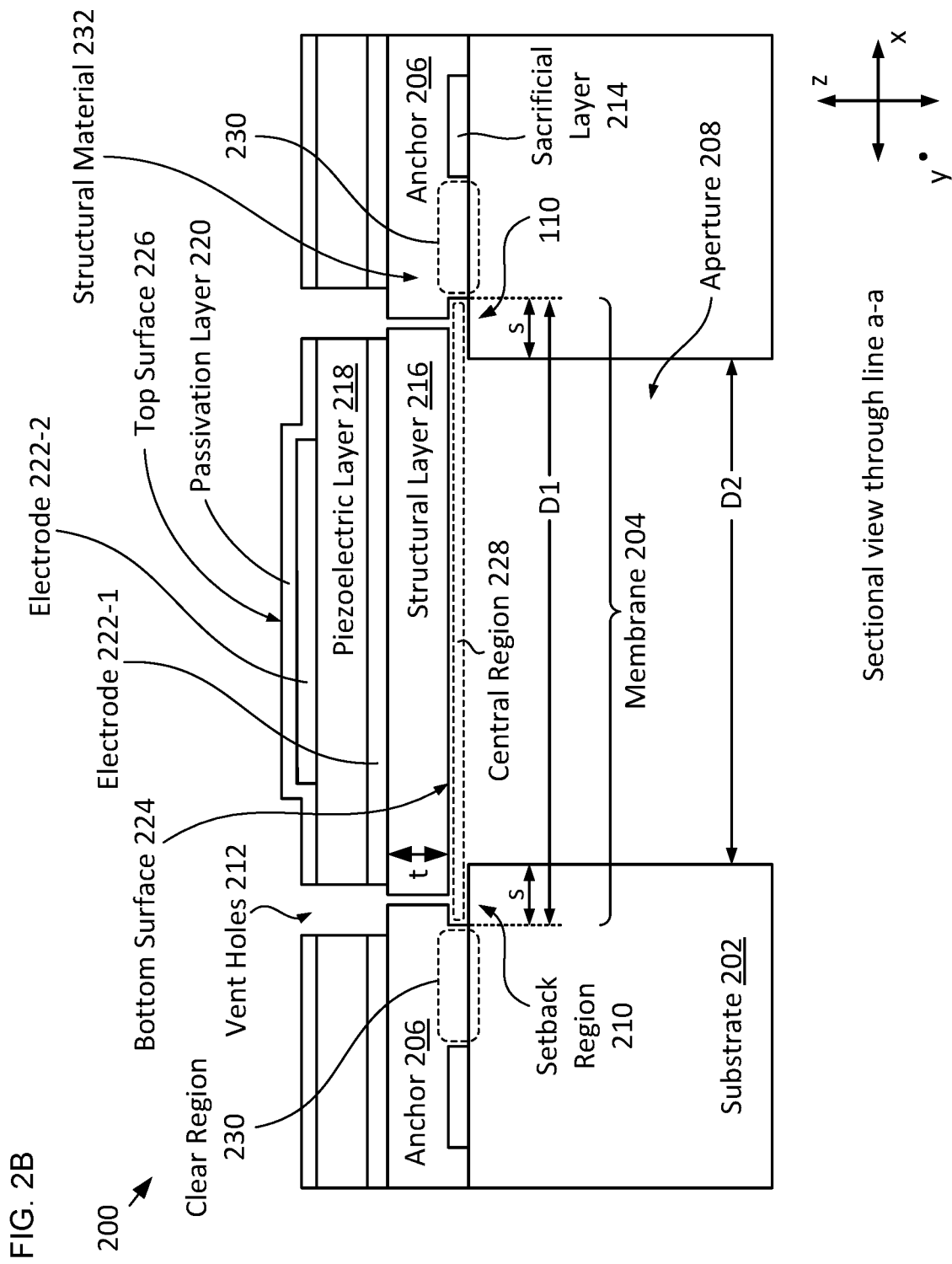

METHOD FOR TUNING THE RESONANT FREQUENCY OF A PIEZOELECTRIC MICROMACHINED ULTRASONIC TRANSDUCER

CROSS REFERENCE TO RELATED APPLICATIONS

This case claims priority of U.S. Provisional Patent Application Ser. No. 62/609,987, filed Dec. 22, 2017, which is incorporated herein by reference. If there are any contradictions or inconsistencies in language between this application and one or more of the cases that have been incorporated by reference that might affect the interpretation of the claims in this case, the claims in this case should be interpreted to be consistent with the language in this case.

TECHNICAL FIELD

The present disclosure is directed to micromachined transducers in general and, more specifically, to piezoelectric transducers.

BACKGROUND

Piezoelectric micromachined ultrasound transducers (PMUTs) are widely used in a variety of sensing, actuation and imaging applications, such as ultrasound therapy, medical imaging, non-destructive evaluation, and the like. Furthermore, PMUTs are particularly well suited for use in arrays due to their low-power requirements and potential small size.

A common PMUT design employs a diaphragm comprising a flexible membrane that includes a layer of piezoelectric material sandwiched by a pair of associated electrodes. To use such a PMUT as an actuator, a periodic electrical signal is applied to the electrodes to drive the membrane into resonance. For use as a sensor, the voltage potential between the electrodes is monitored in response to an applied stimulus, such as incident ultrasonic energy.

Typically, a PMUT operates at the natural resonant frequency of its membrane, which is defined by its material composition, size, thickness and residual stress. In many applications, proper system performance requires that the resonant frequency of a PMUT has a particular value. In some applications, two or more PMUTs are employed in a manner in which they operate cooperatively (e.g., transmitter/receiver pairs, PMUT arrays, etc.). Often, in such multi-PMUT applications, proper system performance requires that their resonant frequencies are closely matched.

While micromachining technology theoretically promises the ability to fabricate a PMUT having a resonant frequency of a precise value, in reality, process tolerances typically give rise to variations in the actual resonant frequency of a realized device. Furthermore, in practice, the properties of a deposited thin-film layer (e.g., thickness, residual stress, etc.) typically vary substantially across the surface of the substrate on which it is formed, leading to a potentially significant variation in the resonant frequencies of PMUTs formed on the same substrate. For PMUT arrays, such variation can be particularly problematic. Still further, variations in process conditions within the extent of a reaction chamber during a fabrication run, or from fabrication run to fabrication run, can give rise to significant variation in the resonant frequencies of PMUTs formed on different substrates.

As a result, fabrication yields of prior-art PMUTs are typically low. Furthermore, prior-art methods for manufacturing PMUTs with closely matched resonant frequencies have been substantially ineffective and/or impractical—particularly, for large numbers of PMUTs distributed over a single substrate or fabricated on different substrates.

The need for a practical, low-cost method for tuning the resonant frequencies of one or more PMUTs remains, as yet, unmet in the prior art.

SUMMARY

The teachings of the present disclosure are directed to the fabrication and frequency tuning of one or more PMUTs to realize a particular resonant frequency and/or match their resonant frequencies. The number of PMUTs that can be frequency tuned in accordance with the present disclosure can range from one device to hundreds of thousands of devices, or more. Embodiments in accordance with the present disclosure are particularly well suited for use in the manufacture of individual PMUTs requiring a particular operating frequency, PMUTs located across one entire substrate, PMUT arrays formed on a single substrate, PMUTs and PMUT arrays located on different substrates, PMUTs located on multiple substrates within a fabrication lot, PMUTs located on multiple substrates fabricated in different fabrication lots, and the like.

As is known in the prior art, the resonant frequency of a thickness-mode resonant element, such as a bulk acoustic wave (BAW) filter, can be tuned by using ion-beam trimming to uniformly remove material over an entire surface of the element, thereby uniformly changing its thickness. It should be noted that thickness uniformity is a critical factor in the operation of a BAW filter, since the resonant frequency of a BAW filter is determined by its thickness and thickness non-uniformity would give rise to undesirable frequency characteristics in its output.

In sharp contrast to the prior art, embodiments in accordance with the present disclosure enable a flexural resonator having a non-uniform stiffness and/or mass profile across a lateral dimension of the resonator, where the non-uniform parameter profile is configured to establish the resonant frequency of the resonator as a desired target resonant frequency. Furthermore, the teachings of the present disclosure include methods in which a membrane modification process that affects the modal stiffness of the flexural resonator more strongly than its modal mass, thereby improving the effectiveness of the modification process.

An illustrative embodiment in accordance with the present disclosure is a method for tuning the resonant frequency of a PMUT having a diaphragm defined by a membrane suspended over an aperture. In the illustrative embodiment, the diaphragm has a circular membrane suspended over a circular aperture, which has a diameter that is smaller than that of the membrane. The difference in the diameters of the membrane and aperture give rise to an annular setback region of the membrane, which extends beyond the lateral extent of the aperture. The membrane includes a structural layer and a piezoelectric layer, where the structural layer is configured to enable motion of the membrane with respect to the substrate and the piezoelectric layer is operatively coupled with the structural layer. The membrane is configured to resonate at its natural resonant frequency with a fundamental flexural mode.

The resonant frequency of the membrane is tuned by directing an ion-beam trimmer at the structural layer through the aperture. As a result, the walls of the aperture shadow the setback region such that the ion beam removes more material near the center of the structural layer than at its perimeter, thereby creating a non-uniform thickness profile over the diameter of the structural layer. Since the inflection points of the fundamental flexural mode are located near the perimeter of the membrane, removal of more material from the center of the structural layer affects the modal stiffness of the membrane to a greater extent than it affects its modal mass.

In some embodiments, the process parameters (e.g. pressure, gas flow, etc.) are adjusted to reduce trimming effectiveness near the walls of the aperture, etc.

In some embodiments, the substrate is tilted and/or rotated relative to the ion beam. As a result, the ion beam can more effectively reach into the setback region at the perimeter of the membrane, locally enhancing the etch rate in the setback region.

In some embodiments, a non-uniform stiffness profile across a membrane is achieved by adding a stiffening layer to the membrane and selectively removing or reducing its thickness in at least one region. In some embodiments, the stiffening layer is directly patterned onto the PMUT by depositing it through a shadow mask.

In some embodiments, a non-uniform mass profile across a membrane is achieved by adding a mass-adding layer to the membrane and selectively removing or reducing its thickness in at least one region. In some embodiments, the mass-adding layer is directly patterned onto the PMUT by depositing it through a shadow mask.

In some embodiments, the stiffness and/or mass of a flexible membrane is changed in uniform fashion by adding or removing material evenly on a surface of the membrane. In such embodiments, the residual stress of the affected material is selected to impart a desired stiffness (and, therefore, resonant frequency) on the completed membrane.

An embodiment in accordance with the present disclosure is a method comprising: establishing a target resonant frequency ($f_0$) and a first range of frequencies ($\Delta f_0$) that includes the target resonant frequency; providing a first piezoelectric micromachined ultrasonic transducer (PMUT) (200) disposed on a substrate (202), wherein the first PMUT includes a first membrane (204) characterized by a first resonant frequency; determining a first value ($f_n$) for the first resonant frequency; and modifying the first membrane to establish a second value ($f_n'$) for the first resonant frequency, the second value being within the first range of frequencies, wherein the first membrane is modified by imparting a first profile of a first parameter along a lateral dimension of the first membrane, and wherein the first parameter is selected from the group consisting of stiffness and mass.

BRIEF DESCRIPTION OF THE DRAWINGS

FIGS. 2A-B depict schematic drawings of top and sectional views of a piezoelectric micromachined ultrasonic transducer (PMUT) in accordance with the present disclosure.

DETAILED DESCRIPTION

Figure 1:
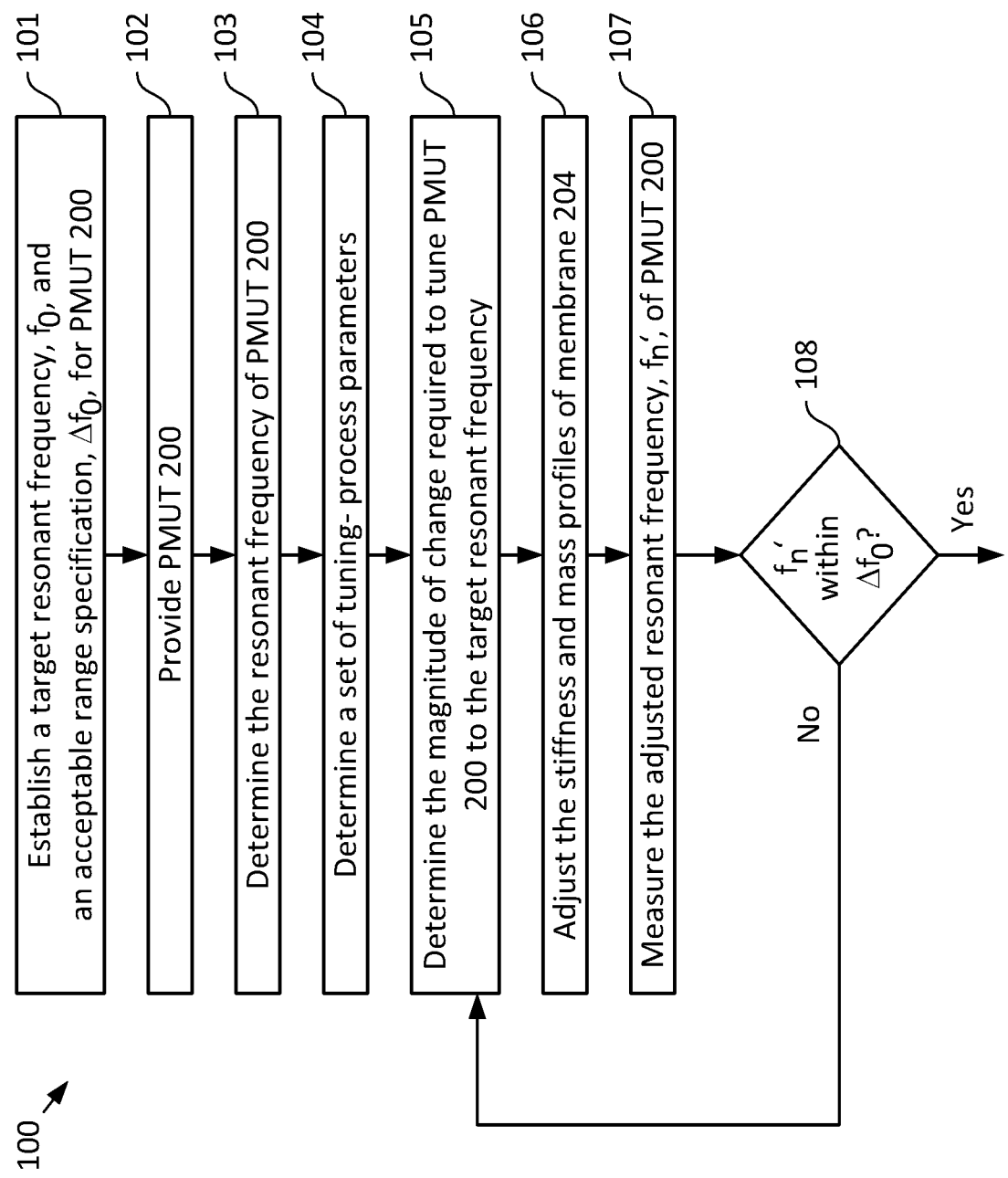
FIG. 1 depicts operations of an illustrative method suitable for tuning the resonant frequency of a PMUT to a target value in accordance with the present disclosure.

FIG. 1 depicts operations of an illustrative method suitable for tuning the resonant frequency of a PMUT to a target value in accordance with the present disclosure. Method 100 is described below with reference to FIGS. 2A-B and 3A-C. Method 100 begins with operation 101, wherein a target resonant frequency, $f_0$, and acceptable frequency range specification, $\Delta f_0$, is defined for a PMUT.

At operation 102, PMUT 200 is provided. In the depicted example, the design of PMUT 200 is intended to realize a fabricated device whose actual resonant frequency, $f_n$, is the target resonant frequency. In some embodiments, the design of PMUT 200 is intended to realize a fabricated device characterized by a different resonant frequency (e.g., $f_n$, as fabricated, is slightly higher or lower than $f_0$) to facilitate tuning of its resonant frequency.

Figure 2A:
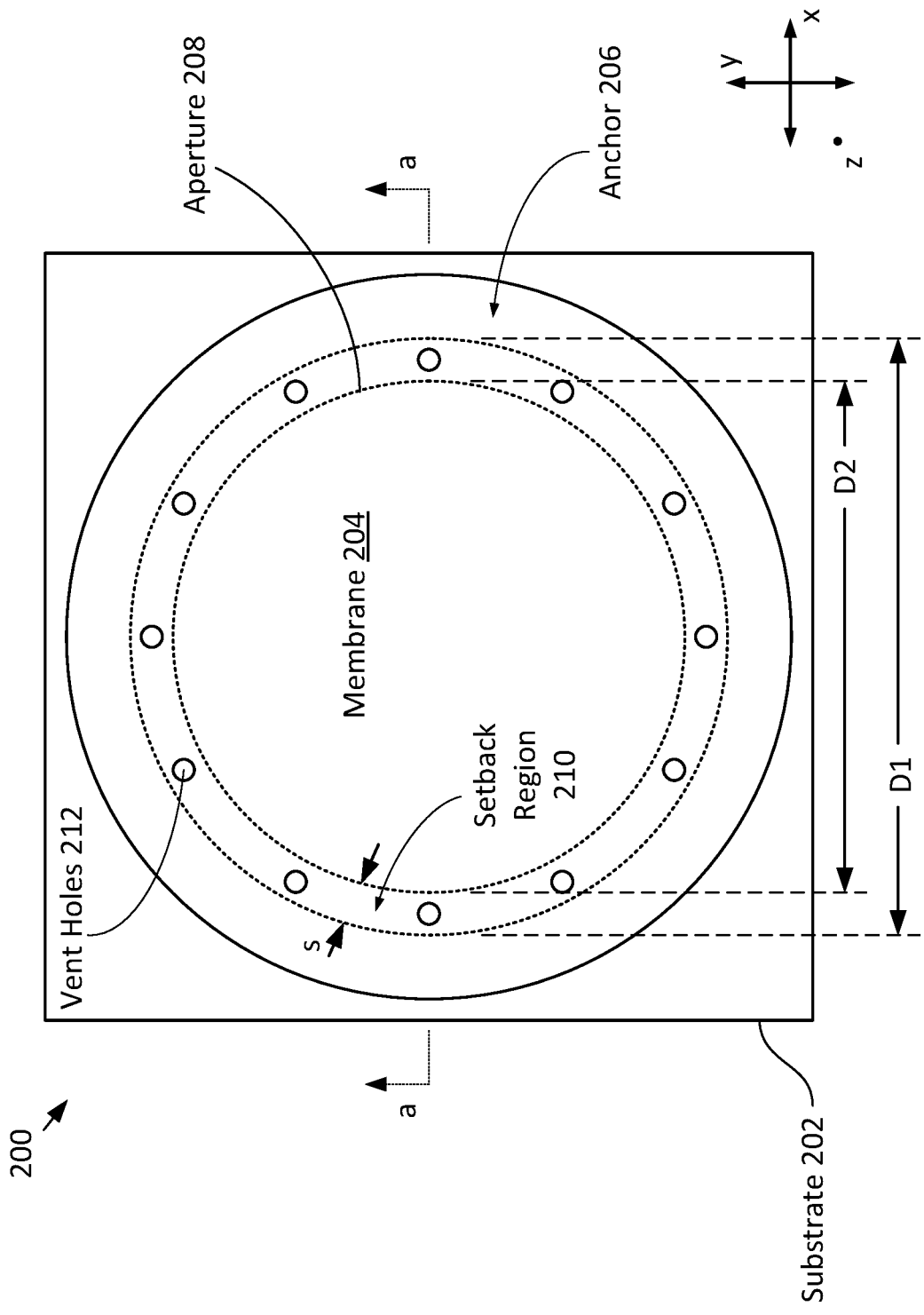

FIGS. 2A-B depict schematic drawings of top and sectional views of a piezoelectric micromachined ultrasonic transducer (PMUT) in accordance with the present disclosure. The view shown in FIG. 2B is taken through line a-a, as depicted in FIG. 2A. PMUT 200 is formed on substrate 202 such that the PMUT includes membrane 204, which extends from anchor 206 such that the membrane is suspended over aperture 208.

Substrate 202 is a conventional substrate suitable for planar processing. In the depicted example, substrate 202 is a single-crystal silicon substrate having a thickness of approximately 500 microns. In some embodiments, substrate 202 has a different thickness that is typically within the range of approximately 100 microns to approximately 20 mm. It should noted, however, that substrate 202 can comprise any suitable material, such as a semiconductor (e.g., silicon, compound semiconductor, silicon carbide, etc.) substrate, glass, ceramic, composite material, and the like, and/or have any practical thickness, without departing from the scope of the present disclosure.

Membrane 204 includes structural layer 216, piezoelectric layer 218, passivation layer 220, and electrodes 222-1 and 222-2 (referred to, collectively, as electrodes 222), which collectively define bottom surface 224 and top surface 226 of the membrane. In the depicted example, membrane 204 is a circular membrane having diameter, D1, of approximately 2 mm. In some embodiments, D1 has a different value that is typically within the range of approximately 20 microns to approximately 20 mm. It should be noted, however, membrane 204 can have any shape (e.g., square, rectangular, elliptical, ovular, etc.) and/or any lateral dimension (e.g., diameter, width, length, etc.) suitable for the application for which the use of PMUT 200 is intended without departing from the scope of the present disclosure.

Structural layer 216 is a layer of structural material 232 that is configured to define anchor 206 and a flexible constituent layer of membrane 204 that enables movement of membrane 204 along the z-direction (i.e., out-of-plane deformation with respect to the x-y plane) once the membrane is released from substrate 202. Structural layer 216 is formed such that it has an initial thickness, t, of approximately 10 microns. In some embodiments, t has a different value that is typically within the range of approximately 0.05 microns to approximately 100 microns. It should be noted, however, that the value of t is typically selected based on the application for which PMUT 200 is intended and can have any practical value without departing from the scope of the present disclosure.

In the depicted example, structural layer 216 comprises a single layer of polysilicon; however, structural layer 216 can include one or more layers of a wide variety of suitable structural materials, including, without limitation, silicon, amorphous silicon, silicon-rich silicon nitride, silicon compounds (e.g., silicon carbide, silicon germanium, etc.), compound semiconductors (e.g., gallium arsenide, indium phosphide, indium gallium arsenide, indium gallium arsenide phosphide, etc.), dielectrics (e.g., silicon nitride, silicon oxynitride, etc.), and the like without departing from the scope of the present disclosure.

Anchor 206 is an annulus of structural material that is in physical contact with the top surface of substrate 202 in clear region 230; therefore, anchor 206 is immovable with respect to substrate 202. Anchor 206 is configured to suspend membrane 204 above the substrate after the membrane has been released. In the depicted example, anchor 206 is a continuous, circular annulus that complete surrounds membrane 204; however, in some embodiments, anchor 206 has a different annular shape or comprises a plurality of discrete "islands" of structural material. As will be apparent to one skilled in the art, after reading this Specification, the configuration of anchor 206 is typically based on the shape of membrane 204.

Piezoelectric layer 218 is a layer of piezoelectric material disposed on structural layer 216. In the depicted example, piezoelectric layer 218 is a layer of aluminum nitride (AlN); however, other piezoelectric materials can be used in piezoelectric layer 218 without departing from the scope of the present disclosure. Alternative piezoelectric materials suitable for use in piezoelectric layer 218 include, without limitation, lead zirconate titanate (PZT), lead lanthanum zirconate titanate (PLZT), niobium-doped PZT (PNZT), scandium-doped aluminum nitride (ScAlN), and the like. Piezoelectric layer 218 resides between electrodes 222-1 and 222-2, each of which is a layer of electrically conductive material that is electrically connected with the piezoelectric layer.

Passivation layer 220 is a thin layer of an electrically insulating material disposed over electrode 222-2 in conventional fashion. In the depicted example, passivation layer 220 comprises silicon nitride; however, other materials suitable for use in passivation layer 220 include, without limitation, aluminum nitride, silicon oxynitride, silicon carbide, silicon dioxide, and the like.

Electrical contact is made to electrodes 222-1 and 222-2 via a pair of contact pads (not shown), which are formed and electrically connected to the electrodes in conventional fashion.

Aperture 208 is a through-hole formed in substrate 202 such that the aperture has diameter, D2, of approximately 1.5 mm. In some embodiments, D1 has a different value that is typically within the range of approximately 10 microns to approximately 20 mm. It should be noted, however, that D2 can have any practical value without departing from the scope of the present disclosure.

The formation of aperture 208 enables passage of acoustic energy to/from the membrane through the substrate. It should be noted that the difference between the diameters of membrane 204 and aperture 208 (i.e., diameters D1 and D2, respectively) define the width, s, of setback region 210.

The shape of membrane 204 is established by patterning full-surface sacrificial layer 214 (typically, silicon dioxide, phosphosilicate glass (PSG), or equivalents) to define central region 228 and clear region 230, which exposes the top surface of substrate 202 around central region 228. As a result, once the constituent layers of membrane 204 are formed and patterned, structural layer 216 is disposed directly on the top surface of substrate 202 in clear region 230, but resides on sacrificial material in central region 228.

In addition to enabling acoustic energy to pass through substrate 202, formation of aperture 208 also exposes the bottom surface of central portion 228, thereby enabling its removal via a conventional sacrificial etch to release membrane 204 from the substrate. Release of membrane 204 makes it mechanically active (i.e., able to move relative to the substrate); however, anchor 206 is rigidly affixed to the substrate.

It should noted that the fabrication steps described above for the formation of PMUT 200 are merely exemplary and that a PMUT can be formed via a wide variety of known micromechanical fabrication approaches, such as surface micromachining, bulk processing, assembly or partial assembly via hybrid assembly processes, etc.

For example, in some embodiments, membrane 204 is formed using conventional surface micromachining techniques, wherein cavity is formed in substrate 202 and subsequently filled with sacrificial material that is subsequently removed after the formation of membrane 204.

In similar fashion, in some embodiments, a field of sacrificial material is defined on the top surface of substrate 202. Membrane 204 is then formed over the sacrificial field such that structural layer 216 extends past the structural material and onto the top surface of the substrate to define immovable anchors. Once the shape and structure of the membrane layers are defined and the sacrificial material is removed, the central portion of the membrane is suspended above substrate 202 via the anchors.

The resonant frequency, $f_n$, of PMUT 200 is based, in part, on the stiffness, k, and mass, m of membrane 204. The stiffness and mass of the membrane are determined by the combined properties of the composite stack of structural layer 216, piezoelectric layer 218, electrodes 222, and passivation layer 220. To first order, the resonant frequency, $f_n$, of membrane 204 can be described as:

$$f_n = \left(\frac{1}{2\Pi}\right)\sqrt{k/m}. \tag{1}$$

In equation (1), the parameters k and m represent the modal stiffness and modal mass (respectively) of the vibration mode shape associated with resonant frequency $f_n$. Both the modal stiffness (referred to herein simply as "stiffness") and modal mass (referred to herein simply as "mass")

depend on material properties (such as the Young's modulus and mass density) and geometry (such as the diameter and thickness of the membrane). The stiffness also depends on the stress present in the membrane layers: just as increasing the tension in a guitar string increases the frequency of sound generated, increasing the tensile stress in the PMUT membrane increases the stiffness and therefore resonant frequency of the PMUT.

In the depicted example, frequency, $f_n$, is 1 MHz; however, in some embodiments, $f_n$, is a different frequency typically within the range of approximately 100 Hz to approximately 50 MHz. It should be noted the value of resonant frequency, $f_n$, is typically chosen based on the application for which the use of PMUT 200 is intended and can be any practical value without departing from the scope of the present disclosure.

As discussed above, it is typical that some parameters of a thin-film layer formed on a substrate are not uniform across the layer. Residual stress and thickness, in particular, are known to vary over the surface of the substrate on which the thin film is formed, from substrate to substrate in multi-substrate fabrication process, and from process run to process run. As a result, the resonant frequency of a fully fabricated PMUT will vary depending upon its location on the substrate, the location of its substrate in the deposition chamber used during batch fabrication, etc., thus making it difficult, if not impossible, to manufacture PMUTs having a particular target value for resonant frequency in high volume.

It is an aspect of the present disclosure, however, that the resonant frequency of a PMUT can be tuned to a specific target value, after it has been fabricated, by adjusting the profile of one or both of the stiffness and mass across a lateral dimension (e.g., diameter) of its membrane by changing the amount of material located in at least one region of the membrane.

At operation 103, the resonant frequency, $f_n$, of PMUT 200 is determined. In the depicted example, the frequency response of PMUT 200 is determined by measuring its impedance spectrum; however, myriad ways to determine the frequency response of a PMUT can be used without departing from the scope of the present disclosure.

At operation 104, a process for modifying the membrane of PMUT 200 to tune its resonant frequency is selected and the tuning parameters that characterize the tuning process are determined. In the depicted example, ion beam trimming is used to modify membrane 204 and the tuning parameters determined in operation 104 include etch rate and etch profile across the ion beam of the ion beam trimming tool for the power level (i.e., ion beam current) to be used during frequency tuning. The set of tuning-process parameters is determined by performing a test etch on an appropriate material layer disposed on a test wafer. In some embodiments, the tuning-process parameters are established by performing one or more test etches in unused regions of structural layer 218. A non-limiting example of such a test etch is the formation of a wedge in a layer of structural material 232, where the wedge is formed by scanning the ion beam over the material at a fixed scan rate while linearly increasing ion beam current.

Although the illustrative embodiment employs ion beam trimming to tune the frequency of a PMUT, many alternative processes, such as laser ablation, ion milling, reactive ion etching, plasma etching, laser-assisted etching, wet-chemical etching, vapor-phase chemical etching, etc., can be used without departing from the scope of the present disclosure. As will be apparent to one skilled in the art, after reading this Specification, the manner in which a set of tuning-process parameters is determined depends upon the process used for frequency tuning.

At operation 105, the change required to tune resonant frequency, $f_n$, to target resonant frequency, $f_0$, is determined.

At operation 106, the stiffness and mass profiles along the diameter of membrane 204 are modified based on the required frequency change established in operation 105.

In the depicted example, the stiffness and mass profiles of membrane 204 are modified by reducing the thickness of structural layer 216 near the center of membrane 204, while leaving its thickness substantially unchanged near its perimeter. This non-uniform thickness profile of structural layer 216 is realized by etching bottom surface 224 using an ion beam trimming tool whose ion beam is directed at the surface through aperture 208. The ion beam has a Gaussian intensity profile with a full-width, half-maximum beam diameter of approximately 5 mm. The ion beam trimmer is directed at PMUT 200 for a dwell time of approximately 4 seconds while its power is held constant at approximately 1000 W. As a result, the ion beam is shadowed by the walls of the aperture and the ion beam removes more material near the center of the structural layer than at its perimeter. This shadowing effect is analogous to the well-known shadowing effect that occurs during material deposition through a conventional shadow mask. In some embodiments, a shadow mask is positioned over aperture 208 during operation 106 to augment the shadowing effect.

Figure 3A:
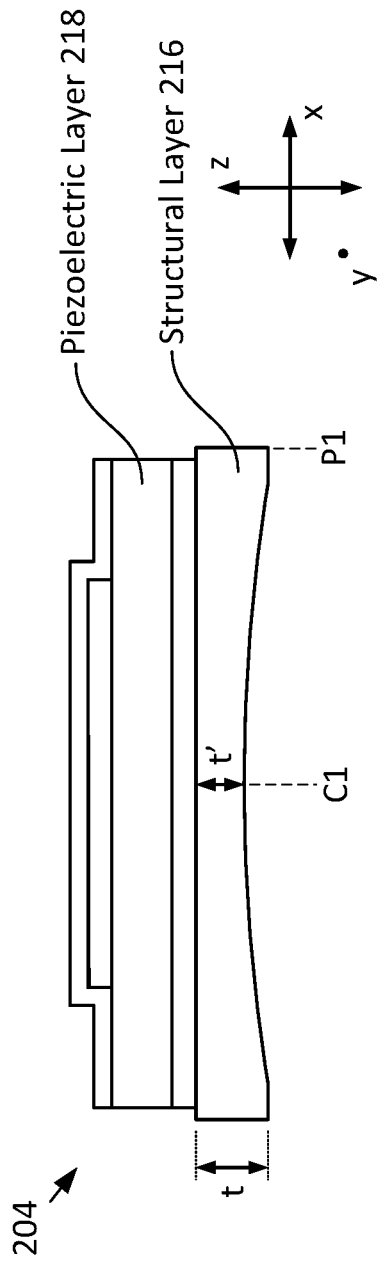
FIG. 3A depicts a schematic drawing of a portion of membrane 204 after operation 106.

FIG. 3A depicts a schematic drawing of a portion of membrane 204 after operation 106. As depicted in FIG. 3A, the thickness of structural layer 216 near its perimeter remains substantially equal to its original thickness, t, while it is reduced to modified thickness, t', at the center of the membrane 204.

In the depicted example, modified thickness, t', is approximately 65% of original thickness, t. It should be noted, however, that t' can have any practical percentage of original thickness, t, without departing from the scope of the present disclosure; however, t' is typically within the range of approximately 1 percent and approximately 100 percent of original thickness, t.

Figure 3B:
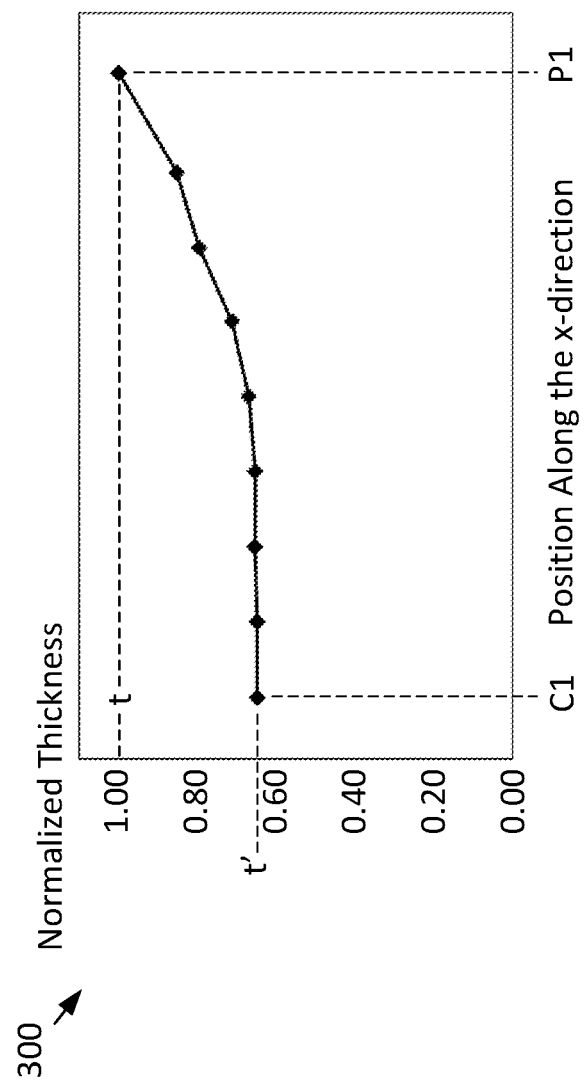
FIG. 3B shows a measured normalized thickness profile of a membrane modified in accordance with the present disclosure.

FIG. 3B shows a measured normalized thickness profile of a membrane modified in accordance with the present disclosure.

Plot 300 shows that the thickness of structural layer 214 at the periphery, P1, of membrane 204 the thickness of the structural layer is substantially equal to t. At the center, C1, of the membrane, however, the thickness of the structural layer is equal to approximately 0.65t, while the thickness varies along radial distance of the membrane according to a roughly Gaussian profile. In some embodiments, a different thickness profile (e.g., parabolic, stepped, linear, etc.) is imparted on structural layer 214.

In the depicted example, by virtue of the depicted Gaussian profile imparted on the thickness of structural layer 214, the resonant frequency of the PMUT is reduced from approximately 1 MHz to approximately 950 kHz.

It should be noted that, ion beam trimming tools have been used in the prior art to trim the resonant frequencies of a bulk acoustic wave (BAW) filters by removing material from their top or bottom electrodes or, in some cases, their piezoelectric layer itself. However, since the resonant frequency of a BAW filter is determined by its thickness, any thickness non-uniformity would give rise to undesirable frequency characteristics in its output. As a result, in such applications, it is critical that the ion beam trimming tool uniformly reduce the thickness of the layer being etched.

In contrast, ion beam trimming tools are used in accordance with the present disclosure to adjust the resonant frequency of a flexural resonator by modifying its stiffness and/or mass, rather than simply uniformly reducing its thickness. Furthermore, preferably, the resonant frequency of a flexural resonator is modified by inducing a non-uniformity in its stiffness and/or mass profile along a lateral dimension of the membrane (e.g., its diameter).

Burst pressure is an important figure of merit for a micromachined transducer and, specifically, a PMUT. Burst pressure is defined as the maximum pressure to which a transducer can be exposed before damage occurs. Typically, when the burst pressure is exceeded a PMUT will fail due to rupture of its membrane. Rupture normally occurs when the pressure-induced stress in the membrane exceeds the fracture strength of the structural material near the edges of the membrane, which is where the induced stress is at a maximum.

It is an aspect of the present disclosure that the frequency of a PMUT can be changed to the desired value without significant impact on its burst pressure by etching the center of the membrane more than edge of the membrane. As a result, significant thickness reduction occurs near the center of the membrane, which has greatest influence on the resonant frequency, while little or no thickness reduction occurs near the edge of the membrane, which has greatest influence on the burst pressure.

In some embodiments, bottom surface 224 is etched using an ion beam trimming tool whose ion beam has a modified etch profile across its width. In accordance with the present disclosure, the etch profile across the width of the ion beam is controlled by adjusting one or more parameters of the ion beam trimming process, such as ion current, dwell time (i.e., how long the beam resides on the PMUT), pressure, gas flow, etc. In some embodiments, the etch rate profile is controlled to realize a different non-uniform shape (e.g., higher etch rate near the perimeter of membrane 204, etc.).

While the use of an ion beam trimming tool to remove material from membrane 204 is preferred, other etch processes can be used without departing from the scope of the present disclosure. Alternative etch processes suitable for removing material from membrane 204 include, without limitation, laser ablation, ion milling, reactive ion etching, plasma etching, laser-assisted etching, wet-chemical etching, vapor-phase chemical etching, and the like.

The removal of more material from structural layer 216 near the center of membrane 204 than in other membrane regions affords significant advantages over the prior-art because it gives rise to a disproportional effect on the vibration-mode shape of the membrane. Referring again to equation (1), parameters k and m also depend on the vibration-mode shape. As a result, material located where the mode shape's curvature is high (such as at the edges and center of the membrane) has an enhanced effect on the modal stiffness while material located where the mode shape's displacement is high (such as at the center of the membrane) has an enhanced effect on the modal mass.

In the depicted example, PMUT 200 has a circular membrane 204 and the PMUT is configured to operate in its fundamental resonant mode. As a result, both the curvature and displacement of the mode shape are maximal in the middle of membrane 204. Since the stiffness depends on the cube of thickness ($t^3$), while the mass depends on thickness (t), selectively removing material from the center of membrane 204 (or removing more material from near its center than elsewhere) more efficiently reduces resonant frequency $f_n$.

As noted above, the curvature of the vibrational mode of membrane 204 is also high near the perimeter of the membrane. As a result, in some embodiments, material is preferentially removed near the perimeter of membrane 204 to modify the modal stiffness of the membrane.

In some embodiments, therefore, the etch-rate profile across the beam of the ion trimming tool is tailored such that it encroaches more effectively into setback region 210 to locally reduce the stiffness of the membrane in this region.

In some embodiments, a non-orthogonal angle between the surface of substrate 202 and the direction of ion flow of the ion beam trimmer is induced to enable the ion beam to encroach further into setback region 210, thereby enhancing material removal in this region. In some of these embodiments, the substrate is also rotated during the etch process to further facilitate removal of material in setback region 210.

In some embodiments, the width, s, of setback region 210 is configured to enhance the amount of material removal effected at the perimeter of membrane 204.

In some embodiments, the diameter of the ion beam is made smaller than D2 and the ion beam is moved in a pattern over the exposed region of membrane 204 to realize a desired non-uniform parameter profile.

In some embodiments, material is preferentially removed near both the center and the perimeter of membrane 204.

While the illustrative embodiment tunes the resonant frequency of membrane 204 by etching at least a portion of structural layer 216, in some embodiments, a different constituent layer of membrane 204 is modified (by either uniform material removal or patterned material removal) to induce a desired resonant-frequency change.

Furthermore, in some embodiments, a disproportionate reduction in the resonant frequency of membrane 204 is achieved by removing a portion of a constituent layer characterized by tensile stress. In similar fashion, in some embodiments, a disproportionate increase in the resonant frequency of membrane 204 is achieved by removing a portion of a constituent layer characterized by compressive stress. As a result, in some embodiments, the constituent layer of membrane 204 that is modified is selected based on its residual stress.

In some embodiments, the stiffness and/or mass profile of membrane 204 is adjusted by selectively adding material to the membrane. In some such embodiments, this is achieved by forming one or more additional "stiffening" layers on at least one of bottom surface 224 and top surface 226, where the stiffening layer has a predictable residual stress (tensile or compressive) and/or is patterned to realize a desired effect on at least one of the stiffness and mass of the membrane. Materials suitable for use in such a stiffening layer include, without limitation, highly tensile materials (e.g., stoichiometric silicon nitride, aluminum nitride, etc.), high-mass materials (e.g., platinum, gold, etc.), compressively stressed layers (e.g., silicon dioxide, etc.), and the like. Processes suitable for adding material to membrane 204 include, without limitation, physical-vapor deposition, chemical-vapor deposition, ion-beam deposition, laser-assisted deposition, and the like.

Figure 3C:
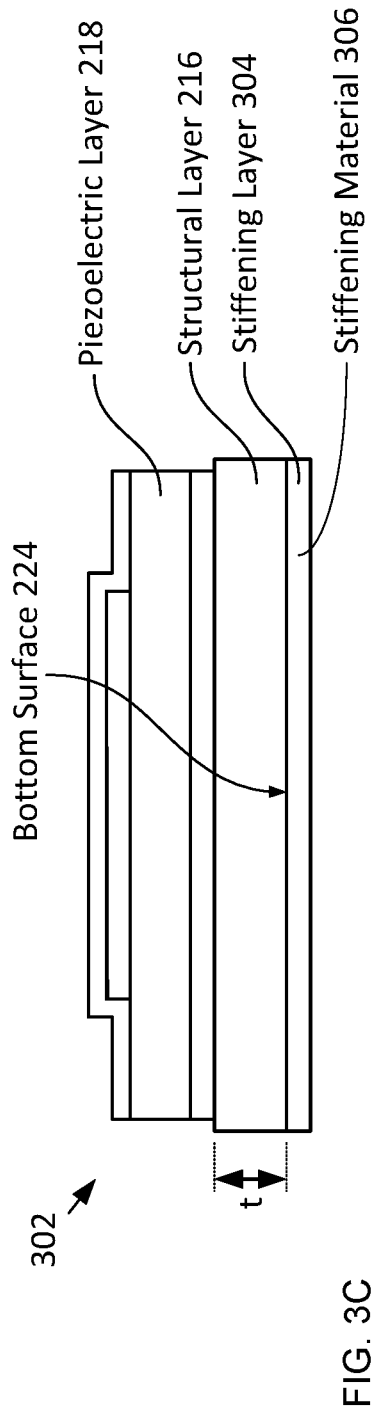
FIG. 3C depicts a schematic drawing of a portion of a membrane after addition of a stiffening layer on bottom surface 224.

FIG. 3C depicts a schematic drawing of a portion of a membrane after addition of a stiffening layer on bottom surface 224.

Membrane 302 includes stiffening layer 304, which is a layer of stiffening material 306. In the depicted example, stiffening material 306 is stoichiometric silicon nitride having a residual tensile stress of approximately 1 GPa and a thickness of approximately 100 nm; however, myriad alternative materials having a wide range of residual stress values can be used in stiffening layer 304 without departing from the scope of the present disclosure.

It should be noted that although membrane 302 includes a stiffening layer disposed on bottom surface 224, one or more stiffening layers can be disposed on top surface 226 without departing from the scope of the present disclosure. Furthermore, although stiffening layer 304 is a single-layer of one material, stiffening layers in accordance with the present invention can comprise more than one sub-layer and/or more than one material.

In some embodiments, one or more of the stiffening layers are patterned after their deposition as a full surface layer. In some embodiments, at least one stiffening layer is directly patterned during its deposition by depositing it through a shadow mask or equivalent. In some embodiments, passivation layer 220 is configured as a stiffening layer. It should be noted that, in embodiments wherein multiple stiffening layers are added, the removal and/or patterning of each layer provides an independently controllable contribution to the overall stiffness of the membrane.

Figure 3D:
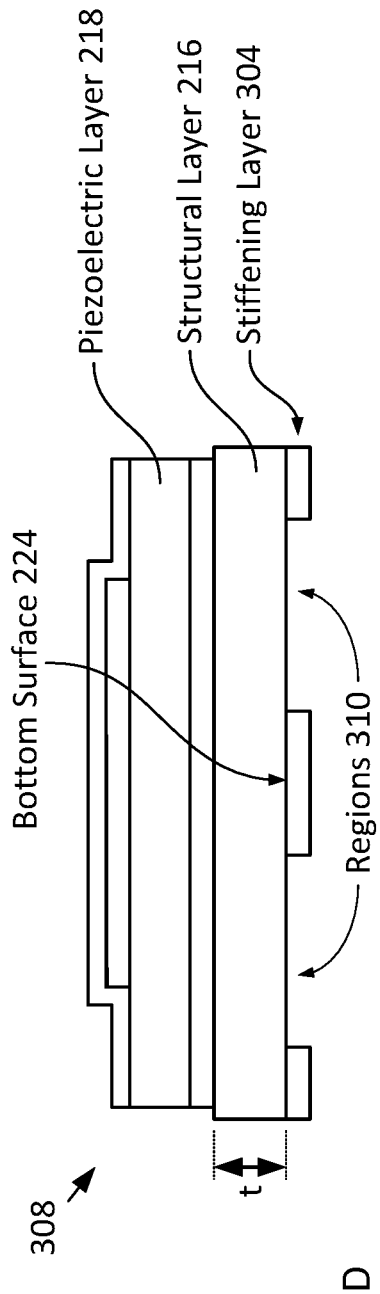
FIG. 3D depicts a schematic drawing of a portion of a membrane after addition of a patterned stiffening layer on bottom surface 224.

FIG. 3D depicts a schematic drawing of a portion of a membrane after addition of a patterned stiffening layer on bottom surface 224.

Membrane 308 includes stiffening layer 304, which is patterned to remove stiffening material 306 from regions 310. As a result, stiffening material remains in areas of the membrane where the curvature of the vibrational mode is large—specifically, near the center and perimeter of the membrane.

In some embodiments, operation 106 is performed after PMUT array 200 is packaged.

In some embodiments, the residual stress in some regions of membrane 204 (or over its entirety) is changed without changing its mass. For example, in some embodiments, laser annealing is used to change the residual stress in at least one region along a lateral dimension of structural layer 216 (or a different constituent layer of membrane 204). In some embodiments, a pattern of energy is directed over a membrane surface to selectively induce a pattern of annealed material. For example, a diffractive optical element (e.g., a Fresnel lens, hologram, dammann grating, etc.) can be used to create a pattern of laser light that is directed at the membrane.

Figure 4:
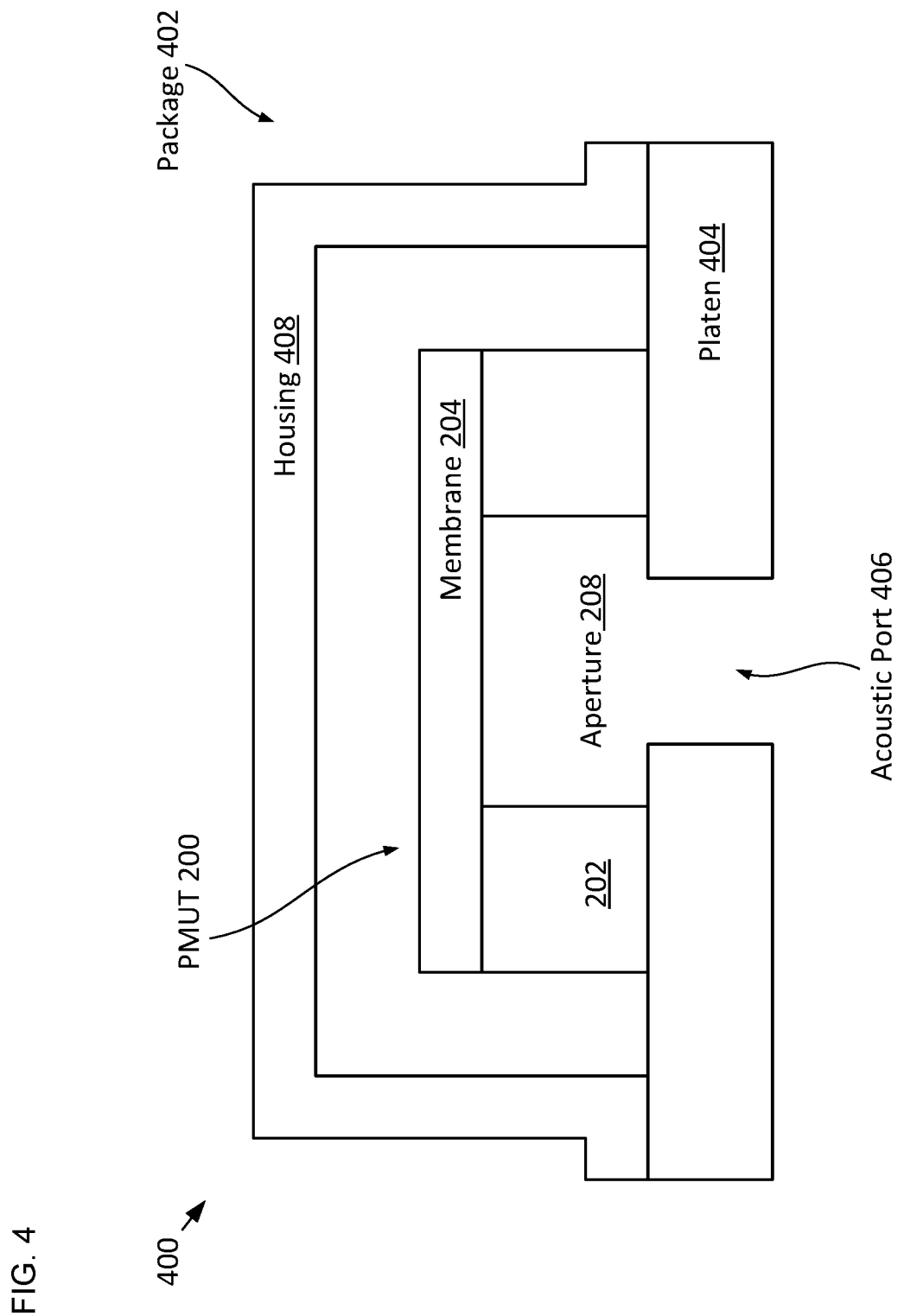
FIG. 4 depicts a portion of a packaged PMUT in accordance with the present disclosure.

FIG. 4 depicts a portion of a packaged PMUT in accordance with the present disclosure. Packaged PMUT 400 includes PMUT 200 and package 402.

Package 402 includes platen 404 and housing 408, where platen 404 includes acoustic port 406.

Housing 408 is a conventional housing configured to join with platen 404 to collectively partially enclose and protect PMUT 200.

PMUT 200 is mounted on platen 404 such that aperture 208 is aligned with acoustic port 406 to enable acoustic energy to transit both package 402 and substrate 202 and reach membrane 204.

In addition to enabling access to membrane 204 for acoustic energy, material can also be added to or removed from membrane 204 through acoustic port 406 to tune the resonant frequency of packaged PMUT 400. The additional structure of acoustic port 404 enhances the shadowing effect described above and with respect to operation 106.

Returning now to operation 100, at operation 107, the adjusted resonant frequency, $f_n'$ of membrane 204 is determined.

At operation 108, a determination is made whether the adjusted resonant frequency, $f_n'$, is within range specification $\Delta f_0$. If it is, method 100 is complete. If not, method 100 returns to operation 105 and operations 105 through 108 are repeated.

In addition to tuning the resonant frequency of an individual PMUT, the teachings of the present disclosure can be directed to realizing a plurality of PMUTS whose resonant frequencies are all equal to a target frequency, or within an acceptable range around the target frequency.

Figure 5:
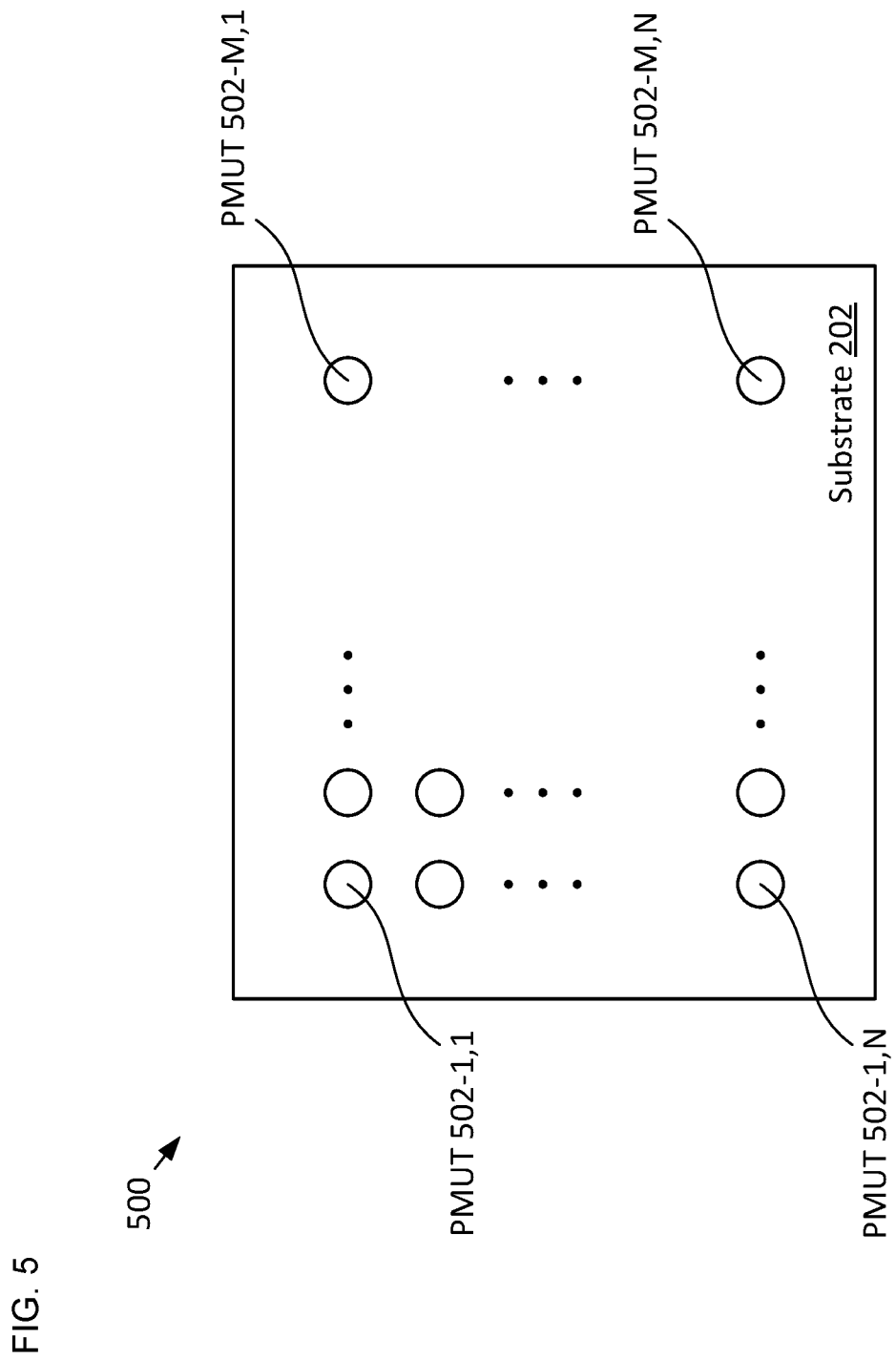
FIG. 5 depicts a schematic drawing of a top view of an illustrative embodiment of a plurality of piezoelectric micromachined ultrasonic transducers (PMUTs) on a common substrate in accordance with the present disclosure.

FIG. 5 depicts a schematic drawing of a top view of an illustrative embodiment of a plurality of piezoelectric micromachined ultrasonic transducers (PMUTs) on a common substrate in accordance with the present disclosure. PMUT array 500 includes substrate 202 on which PMUTs 502-1,1 through 502-M,N are disposed, where M and N have any practical values (e.g., as few as two and as many as tens to hundreds of thousands or more). Each of PMUTs 502-1,1 through 502-M,N (referred, collectively, as PMUTs 502) is analogous to PMUT 200 described above. In the depicted example, PMUTs 502 are arranged in an ordered two-dimensional array. In some embodiments, PMUTs 502 are arranged in an arrangement other than an array (e.g., a line, a non-ordered arrangement, a hexagonal arrangement, etc.).

Figure 6:
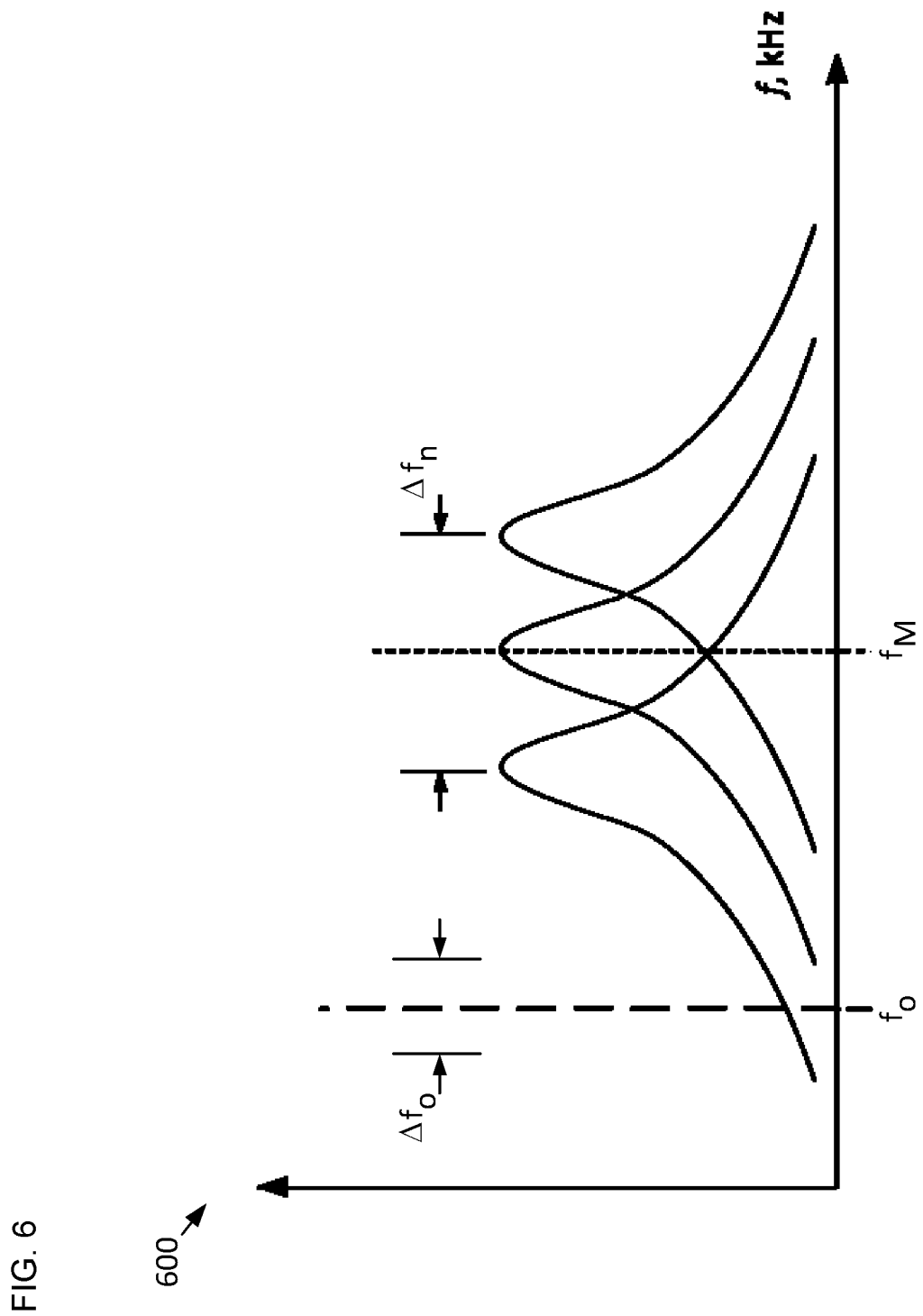
FIG. 6 depicts a typical plot of the resonant frequencies of a representative plurality of PMUTs as formed on the same substrate.

FIG. 6 depicts a typical plot of the resonant frequencies of a representative plurality of PMUTs as formed on the same substrate. Plot 600 shows that the mean frequency $f_M$ of the PMUTs is significantly higher than target operating frequency $f_0$. In addition, the range, $\Delta f_n$, of the resonant frequencies of the PMUTS is larger than the target range, $\Delta f_0$.

Figure 7:
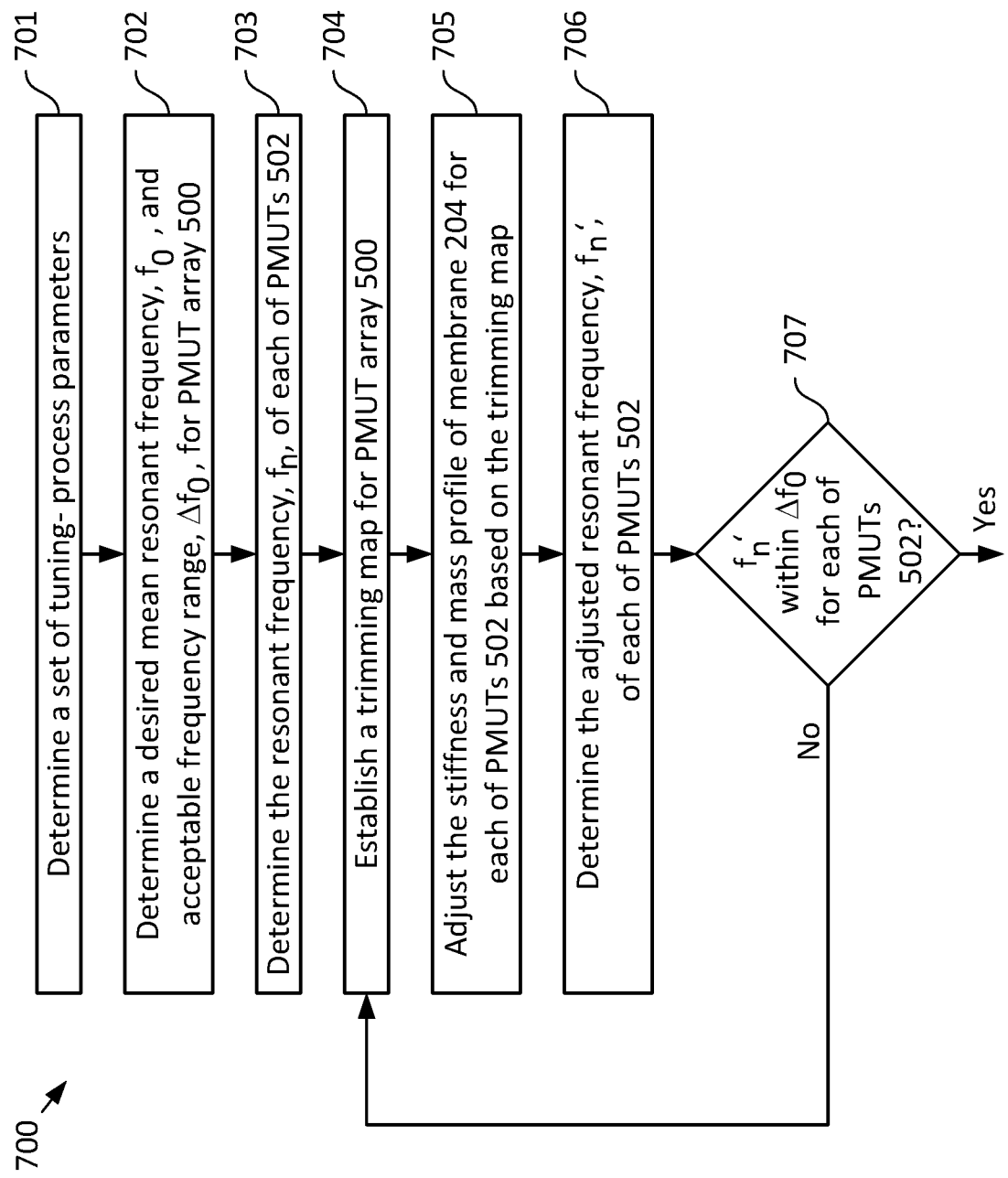
FIG. 7 depicts operations of a method suitable for controlling the resonant frequencies of a plurality of PMUTs in accordance with the present disclosure.

FIG. 7 depicts operations of a method suitable for controlling the resonant frequencies of a plurality of PMUTs in accordance with the present disclosure. Method 700 begins with operation 701, wherein a process for modifying the membranes of PMUT 502 to tune their resonant frequencies is selected and the tuning parameters of the tuning process are determined. Operation 701 is analogous to operation 104 described above and with respect to method 100. In the depicted example, the tuning process selected is ion beam trimming, as discussed above.

At operation 702, wherein a desired mean resonant frequency, $f_0$, and acceptable frequency range, $\Delta f_0$, for a plurality of PMUTs are established.

At operation 703, for i=1 through M and j=1 through N, the resonant frequency $f_n$-i-j of PMUT 502-*i-j* is determined. Typically, the frequency response of each PMUT is determined by measuring the impedance spectrum of the device.

In some embodiments, not every PMUT 502 is measured in operation 702. For example, in some embodiments, only a subset of PMUTs 502 is measured (e.g., every other, every third, one out of ten, one out of one hundred, etc.).

At operation 704, a trimming map is established based on measured resonant frequencies measured in operation 702. The trimming map establishes the change required to tune the resonant frequency of each of PMUTs 502.

At operation 705, for i=1 through M and j=1 through N, the profile of the stiffness and mass of membrane 204 of PMUT 502-*i-j* is adjusted based on the trimming map established in operation 704. The resonant frequency is tuned by adjusting the profile of the stiffness and mass of membrane 204 as described above and with respect to operation 106 of method 100.

In the depicted example, membranes 204 of PMUTS 502 are modified by scanning the ion beam of the ion trimmer in a raster pattern at a constant scan rate such that the ion beam interacts with each PMUT. As the ion beam is scanned, the ion beam current is adjusted based on the set of tuning-process parameters determined in operation 701. In some embodiments, the ion beam current is held constant and the scan rate of the ion beam is varied such that the dwell time at each PMUT is based on the required adjustment indicated by the trimming map.

Furthermore, in the depicted example, the diameter of ion beam is large enough that it covers several PMUTS, thereby enabling them to be tuned simultaneously. In some embodiments, the diameter of the ion beam is only large enough to tune one PMUT at time. In some embodiments, the diameter of the ion beam is smaller than the diameter of membrane 204, thereby enabling greater control over the spatial characteristics of the parameter profile imparted on the membrane during its tuning.

At operation 706, the adjusted resonant frequency, $f_n'$, of each of PMUTS 502 is determined.

At operation 707, a determination is made whether the adjusted resonant frequency, $f_n'$, for each of PMUTs 502 is within range specification $\Delta f_0$. If it is, method 700 is complete. If not, method 700 returns to operation 704 and operations 707 through 708 are repeated.

It is to be understood that the disclosure teaches just some examples of embodiments in accordance with the present invention and that many variations of the invention can easily be devised by those skilled in the art after reading this disclosure and that the scope of the present invention is to be determined by the following claims.

What is claimed is:

1. A method comprising:
establishing an acceptable range of resonant frequencies ($\Delta f_0$) for a plurality of piezoelectric micromachined ultrasonic transducer (PMUTs) (500);
providing the plurality of PMUTs such that each PMUT of the plurality thereof includes a membrane (204) that is characterized by a first design that includes a first lateral dimension (D1), a center (C1), and a periphery (P1), wherein each PMUT of the plurality thereof has a resonant frequency that is based on at least one of the stiffness and mass of its respective membrane;
determining a preliminary value ($f_n$-1,1 through $f_n$-M,N) for the resonant frequency of each PMUT of the plurality thereof;
determining a first desired resonant-frequency change for a first PMUT (502-1,1) of the plurality thereof, wherein the first desired resonant-frequency change is based on the acceptable range of resonant frequencies, the preliminary value ($f_n$-1,1) for the first PMUT, and at least one other preliminary value of the plurality thereof; and
imparting the first desired resonant-frequency change on the first PMUT by establishing a first profile of at least one of stiffness and mass along the first lateral dimension of the first membrane (204-1,1).

2. The method of claim 1 further comprising:
establishing a target resonant frequency ($f_0$) that is within the acceptable range of resonant frequencies, wherein the first desired resonant-frequency change is further based on the target resonant frequency;
determining a second desired resonant-frequency change for a second PMUT (502-M,1) of the plurality thereof, wherein the second desired resonant-frequency change is based on the acceptable range of resonant frequencies, the target resonant frequency, and the preliminary value ($f_n$-M,1) for the second PMUT; and
imparting the second desired resonant-frequency change on the second PMUT by establishing a second profile of at least one of stiffness and mass along the first lateral dimension of the second membrane (204-M,1).

3. The method of claim 2 wherein the method further comprises:
establishing a trimming map for the plurality of PMUTs, the first trimming map including a desired resonant-frequency change for each PMUT of the plurality thereof and including the first and second desired resonant-frequency changes, wherein the trimming map is based on the acceptable range of resonant frequencies, the target resonant frequency, and the plurality of preliminary values.

4. The method of claim 2 wherein the plurality of PMUTs is provided such that the first PMUT is disposed on a first substrate and the second PMUT is disposed on a second substrate that is different than the first substrate.

5. The method of claim 1 wherein the first profile is established by removing a first material (232) from a first surface (224-1,1) of the first membrane.

6. The method of claim 5 wherein the first material is characterized by a first residual stress, and wherein the first profile is further based on the first residual stress.

7. The method of claim 5 wherein the first material is removed via an ion beam trimmer.

8. The method of claim 7 wherein ion beam trimmer is characterized by an ion current, and wherein the first profile is imparted by controlling at least one of the ion current and a dwell time of the ion trimmer at the first PMUT.

9. The method of claim 5 wherein the plurality of PMUTs is provided such that the first PMUT is disposed on a substrate (202) such that the first membrane is suspended over a first aperture (208-1,1), the first membrane including a structural layer (216-1,1) that comprises the first surface, and wherein the first material is removed by etching the first surface through the first aperture.

10. The method of claim 9 wherein the first aperture has a second lateral dimension (D2), and wherein the first lateral dimension and second lateral dimension collectively define a setback region (210-1,1) having a first width (s), and further wherein the method further includes enhancing an etch rate of the first material in the setback region.

11. The method of claim 10 wherein the substrate defines a first plane and wherein the etch rate in the setback region is enhanced by operations comprising:
directing a first etch as a directional etch oriented along a first direction; establishing a non-orthogonal angle between the first plane and the first direction; and rotating the substrate in the first plane.

* * * * *